United States Patent [19]
Yilmaz et al.

[11] Patent Number: 4,795,716
[45] Date of Patent: Jan. 3, 1989

[54] METHOD OF MAKING A POWER IC STRUCTURE WITH ENHANCEMENT AND/OR CMOS LOGIC

[75] Inventors: Hamza Yilmaz, Raleigh; Robert S. Wrathall, Durham; Mike F. Chang, Cary; Robert G. Hodgins, Raleigh, all of N.C.

[73] Assignee: General Electric Company, Fairfield, Conn.

[21] Appl. No.: 64,133

[22] Filed: Jun. 19, 1987

[51] Int. Cl.⁴ .................. H01L 21/22; H01L 21/306; H01L 21/265
[52] U.S. Cl. ........................ 437/27; 437/29; 437/34; 437/54; 437/56; 437/74
[58] Field of Search .............. 437/34, 29, 54, 56, 437/74, 27

[56] References Cited
U.S. PATENT DOCUMENTS

| | | | |
|---|---|---|---|
| 4,346,512 | 8/1982 | Liang et al. | 437/34 |
| 4,376,286 | 3/1983 | Lidow et al. | 357/23 |
| 4,403,395 | 9/1983 | Curran | 437/74 |
| 4,409,725 | 10/1983 | Hotta et al. | 437/74 |
| 4,443,931 | 4/1984 | Baliga et al. | 437/29 |
| 4,616,405 | 10/1986 | Yasuoka | 437/54 |
| 4,633,572 | 1/1987 | Rusch et al. | 437/45 |
| 4,637,125 | 1/1987 | Iwasan et al. | 437/34 |

Primary Examiner—Upendra Roy
Attorney, Agent, or Firm—Stanley C. Corwin; Birgit E. Morris; Kenneth R. Glick

[57] ABSTRACT

A process for fabricating a power IC structure which includes the following masking steps:
1. CMOS P well mask
2. JFET (short-channel implant) mask
3. Field oxide growth mask
4. Deep P+ mask
5. Polysilicon mask
6. DMOS P well mask
7. n−/n+ mask
8. Contact window mask
9. Metalization mask
10. Overglass mask.

25 Claims, 6 Drawing Sheets

METHOD OF MAKING A POWER IC STRUCTURE WITH ENHANCEMENT AND/OR CMOS LOGIC

BACKGROUND OF THE INVENTION

I. Field of the Invention

The present invention relates in general to the fabrication of a semiconductor device, and more particularly to the fabrication of a power IC semiconductor structure.

II. Description of Related Art

Fabrication processes have recently been developed that retain the standard steps used for the fabrication of discrete power devices but expand these steps to include the fabrication of IC control devices. Several high-powered technologies can be used in these IC fabrication processes that take advantage of vertical power device fabrication steps to form standard CMOS devices at the same time that the power device is made. This combination of wafer fabrication steps retains the desired features of both technologies and offers a cost-effective, space saving alternative, as well as bringing new performance features to the system design.

Heretofore, the combination of the power device with the control circuitry required a relatively lengthy fabrication process. Typically, more than ten mask layers have been required to fabricate a device combining power circuitry and control circuitry.

It is therefore an object of the present invention to provide an improved method of fabricating a semiconductor device which is not subject to the foregoing problems and disadvantages.

It is an additional object of the present invention to provide an improved method of manufacturing a simple power IC structure which may include self-aligned CMOS.

It is another object of the present invention to provide an improved method of manufacturing a semiconductor device in which a high-density DMOSFET may be integrated with a 20-volt or 5-volt CMOS IC.

It is a further object of the present invention to provide an improved method of fabricating a power IC structure which may have relatively high density and/or low "on" resistance.

It is another object of the present invention to provide an improved method of fabricating a power IC structure in which a 50 V lightly doped chain N channel MOSFET may be integrated with a 20-volt depletion mode N channel MOSFET.

It is a further object of the present invention to provide an improved method of fabricating a basic structure for a power IC with high density digital IC capability.

SUMMARY OF THE INVENTION

In accordance with the present invention, these and other objectives are achieved by providing a process for fabricating a power IC structure which includes the following masking steps:
1. CMOS P well mask
2. JFET (short-channel implant) mask
3. Field oxide growth mask
4. Deep P+mask
5. Polysilicon mask
6. DMOS P well mask
7. n−/n+mask
8. Contact window mask
9. Metalization mask
10. Overglass mask.

A nonself-aligned P channel MOSFET may also be fabricated in accordance with one embodiment of the process of the present invention by eliminating masking step 7 from the above process sequence.

DESCRIPTION OF THE DRAWINGS

A detailed description of the invention will be made with reference to the accompanying drawings, wherein like numerals designate corresponding parts in the several figures.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention. The scope of the invention is defined by the appended claims.

Figure 1:
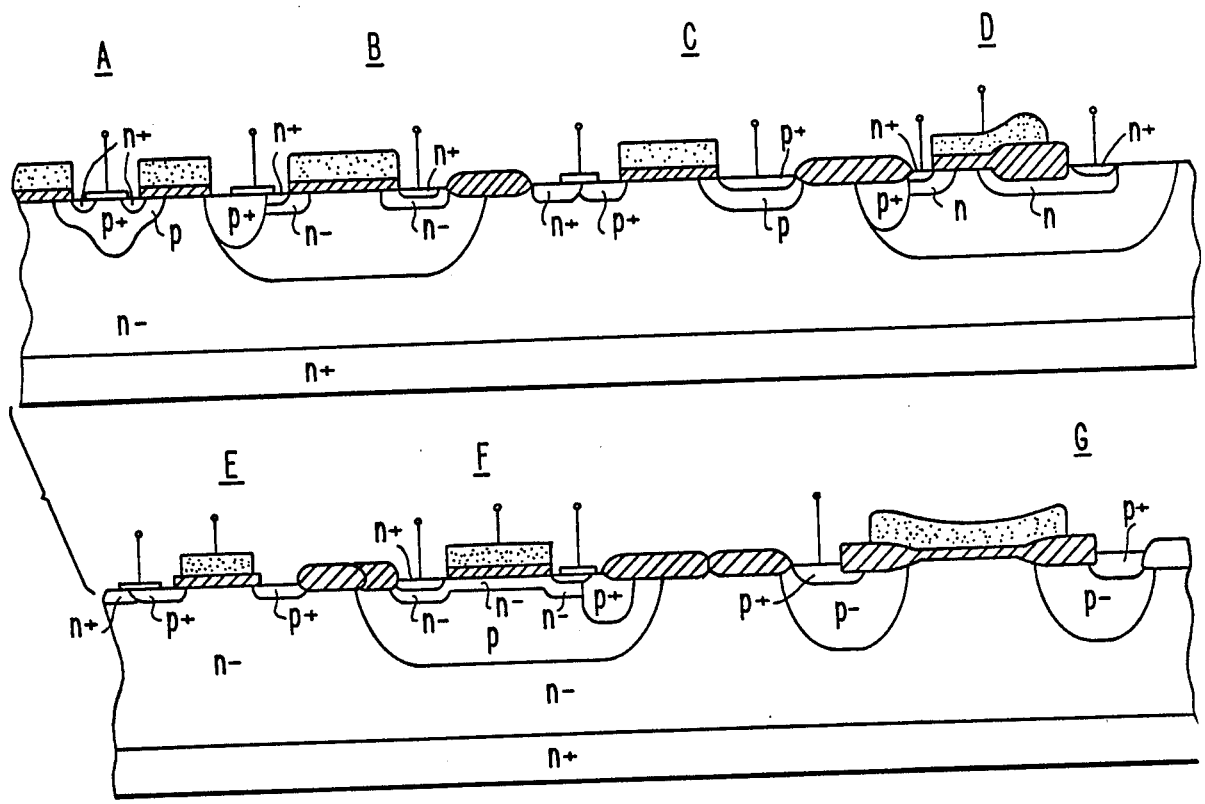
FIG. 1 is a side-sectional view of an exemplary power IC structure manufactured by a process in accordance with one embodiment of the present invention.

Referring to FIG. 1, there is illustrated a side-sectional view of an exemplary power IC structure manufactured by a process in accordance with one embodiment of the present invention. The power IC structure illustrated in FIG. 1 includes the following devices (reading from left to right): a vertical DMOS power device A; a relatively high voltage N channel MOSFET B; a relatively high voltage P channel MOSFET C (which, together with the adjacent high voltage N channel MOSFET B, forms a CMOS device); a relatively high voltage lateral N channel MOSFET D; a relatively low voltage P channel MOSFET E; a relatively low voltage depletion mode MOSFET F; and a relatively high voltage P channel MOSFET G.

It should be recognized that the process of the present invention may be utilized to manufacture a wide variety of other structures. Such other structures may include, for example, bipolar devices or zener diodes. FIG. 1 therefore illustrates just one of a variety of structures which may be fabricated using the process of the present invention.

Figure 2:
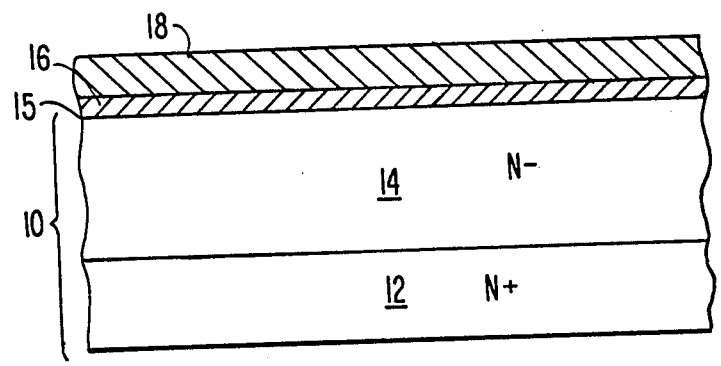
FIGS. 2–13 are side-sectional views illustrating aspects of a process sequence in accordance with one embodiment of the present invention.

Referring now to FIGS. 2–13, a preferred embodiment of the present invention, including a process and a resulting device, will be described. As shown in FIG. 2, a wafer 10 is initially provided, preferably of silicon semiconductor material, comprising, for example, an N+ layer 12 having an N− epitaxial layer 14 thereon. The N− layer 14 includes a major surface 15 of the wafer 10.

In the preferred embodiment, the N+ layer 12 may comprise a commercially available material doped with antimony or arsenic to a relatively high impurity concentration level of about $5 \times 10^{18}$ atoms per cubic centimeter. The N− layer 14 may typically be epitaxially grown on the N+ layer 12, and will have a thickness which may vary depending upon the application for which the device is intended. In the preferred embodiment, the N− layer 14 has a thickness of approximately six microns, with a dopant concentration of about $5 \times 10^{15}$ atoms per cubic centimeter.

In accordance with a preferred embodiment of the present invention, an oxide layer 16 (e.g., silicon dioxide), preferably having a thickness of about five hundred angstroms, may be formed on the major surface 15 of the wafer 10. The oxide layer 16 may be formed by thermal growth which results when wafer 10 is placed in a heated furnace together with an oxidizing gas. The oxide layer 16 may also be formed by other processes, such as deposition on wafer 10. Further, other insulating layers may be used in lieu of the oxide layer 16. While the oxide layer 16 acts primarily as an ion implant damage screen, its placement on the major surface 15 is optional and the formation of the oxide layer 16 does not comprise an essential part of the present invention.

1. CMOS P well mask

Figure 3:
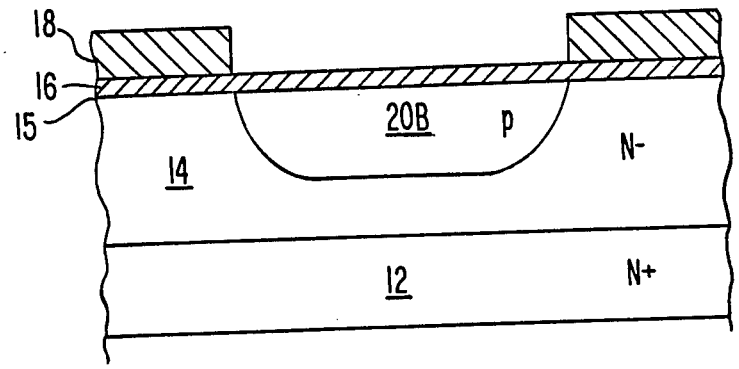

Referring now to FIG. 3, a "CMOS P well" photoresist 18 is next deposited on top of at least a portion of the oxide layer 16. The CMOS P well photoresist 18 is used as a P well mask, leaving exposed those regions of the N— layer 14 where subsequent P well formation is desired and serving as a mask or barrier to prevent implantation in those regions of the N— layer 14 where P well formation is not desired.

A P- type dopant ion, such as boron, is next implanted into those regions of the N— layer 14 which are exposed by the CMOS P well photoresist 18. The single-charged boron ions which are used for this implantation preferably have an energy of between approximately 30 KeV and 150 KeV, depending upon the depth desired for the P wells. The boron implantation dose is approximately $10^{13}/cm^2$.

Figure 4:
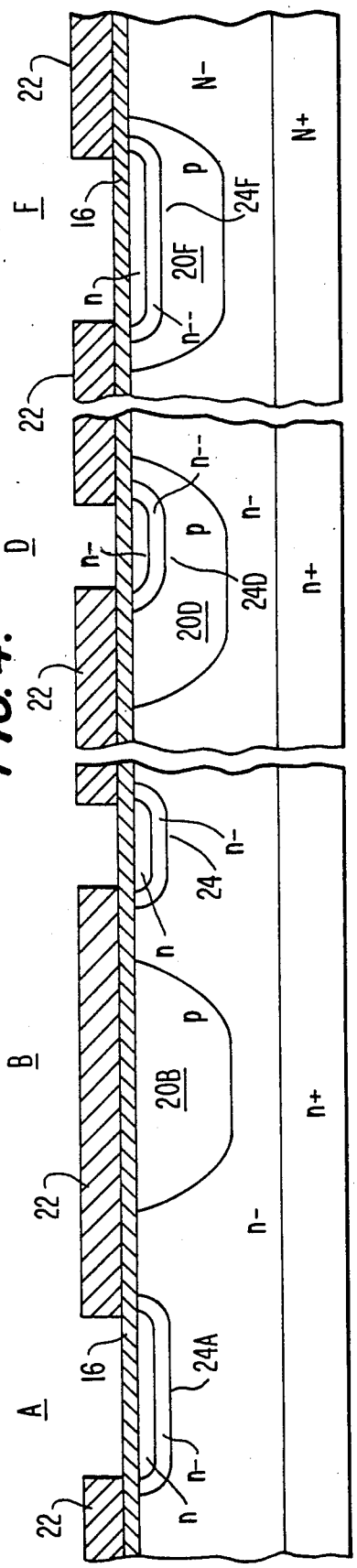

After implantation of the boron ions, the wafer 10 is heated to a relatively high temperature to thereby drive the boron dopant ions deeper into the substrate 14, providing one or more P wells 20 having profiles such as illustrated in FIG. 3 by the P well 20B of the high voltage N channel MOSFET B. The CMOS P well masking step of the present invention may also be utilized in the formation of similar P wells 20 in, for example, the high voltage lateral N channel MOSFET D and the low voltage depletion mode MOSFET F, as illustrated in FIGS. 1 and 4.

It should be noted that, in the preferred embodiment of the present invention, the P wells 20B of the high voltage P channel MOSFET G are also formed by the CMOS P well masking step, prior to the formation of the polysilicon gate. Therefore, the polysilicon gate cannot be used to define the edges of the source and drain regions of the high voltage P channel MOSFET G, and there will consequently be a certain degree of nonalignment between the gate and the source and drain regions. The high voltage P channel MOSFET G of the final semiconductor device may therefore be described as "nonself-aligned".

In other devices, such as the high voltage N channel MOSFET B, the source and drain regions are formed after the formation of the polysilicon gate. The polysilicon gate may therefore be used to define the edges of the source and drain regions of the high voltage N channel MOSFET B, and there will consequently be a greater degree of alignment between the gate and the source and drain regions. Such devices may therefore be referred to as "self-aligned".

The process of the present invention therefore enables the creation of a single semiconductor device which may include various combinations of both self-aligned and nonself-aligned devices. Depending upon the specific requirements of the final semiconductor product, the process sequence of the present invention may also be arranged to produce a semiconductor device in which all devices are fully self-aligned.

2. JFET Mask

Referring now to FIG. 4, the CMOS P well photoresist 18 is removed and a "JFET" photoresist 22 is next deposited on top of at least a portion of the oxide layer 16. The JFET photoresist 22 is used to pattern the N— substrate 14, leaving exposed those regions of the N— substrate 14 where subsequent JFET ion implantation is desired and serving as a mask or barrier to prevent JFET ion implantation in those regions of the N— substrate 14 where JFET formation is not desired.

N type dopant ions, such as phosphorous and arsenic, are then implanted into those regions of the N— layer 14 which are not masked by the JFET mask layer 22. The phosphorous ions which are used for this implantation preferably have an energy of between approximately 60 KeV and 150 KeV, while the arsenic ions used for this implantation preferably have an energy of between approximately 60 KeV and 150 KeV, depending upon the depth desired for the JFET ion implant regions. The phosphorous implantation dose is approximately $5E11 cm^{-2}$ to $5E12 cm^{-2}$ and the arsenic implantation dose is approximately $5E11 cm^{-2}$ to $5E12 cm^{-2}$. Implantation of phosphorous and arsenic ions through openings in the JFET mask layer 22 results in an N— substrate 14 having a profile as shown in FIG. 4.

In FIG. 4, the labels "n", "n—" and "n— —" are used to designate the relative concentrations of the arsenic and phosphorous dopant ions in the JFET implant regions 24. The implanted arsenic ions do not diffuse as rapidly as the implanted phosphorous ions. Therefore, the implanted arsenic ions tend to "pile up" near the major surface 15. The implanted phosphorous ions, on the other hand, tend to diffuse into a larger area. As a consequence, the charge per unit area of the phosphorous ion regions within the JFET implant regions 24 will be relatively smaller than the charge per unit area of the arsenic ion regions within the JFET implant regions 24. The phosphorous ion regions are therefore designated with the label "n—" or "n— —" (depending upon the background doping of the JFET implant region 24) and the corresponding arsenic ion regions are designated with the label "n" or "n—", respectively.

As illustrated in FIG. 4, the JFET masking step may be used, for example, in the formation of N type dopant regions 24F, 24D and 24A in the depletion mode NMOS device F, the high voltage lateral NMOS device D, as well as the DMOS power device A, respectively.

In the depletion mode NMOS device F, the JFET implant region 24F comprises a thin n— — layer inside the previously formed P well 20F and a highly concentrated n— epitaxial surface layer. In the high voltage lateral NMOS device D, the JFET implant region 24D comprises an n—/n— — region which will lie underneath a subsequently deposited thick oxide layer.

In the DMOS power device A, a subsequent implant of P+ ions during the deep P+ masking step will compensate the negative dopant ions in the JFET implant region 24A. The effect of the JFET masking step in the DMOS power device A will therefore be seen only outside of the subsequently formed P region, under the polysilicon gate (as will be explained in greater detail below). The JFET masking step thereby shortens the channel of the DMOS power device A and therefore gives low "on" resistance of the DMOS power device.

The JFET masking step may also be utilized in the formation of N type dopant regions between devices, as, for example, the JFET region 24 between the high voltage N channel MOSFET B and the high voltage P channel MOSFET C. These inter-device dopant regions created by the JFET masking step act as high field threshold regions, serving as a barrier to isolate the active devices from one another and to prevent the formation of parasitic effect.

3. Field Oxide Growth Mask

Figure 5:
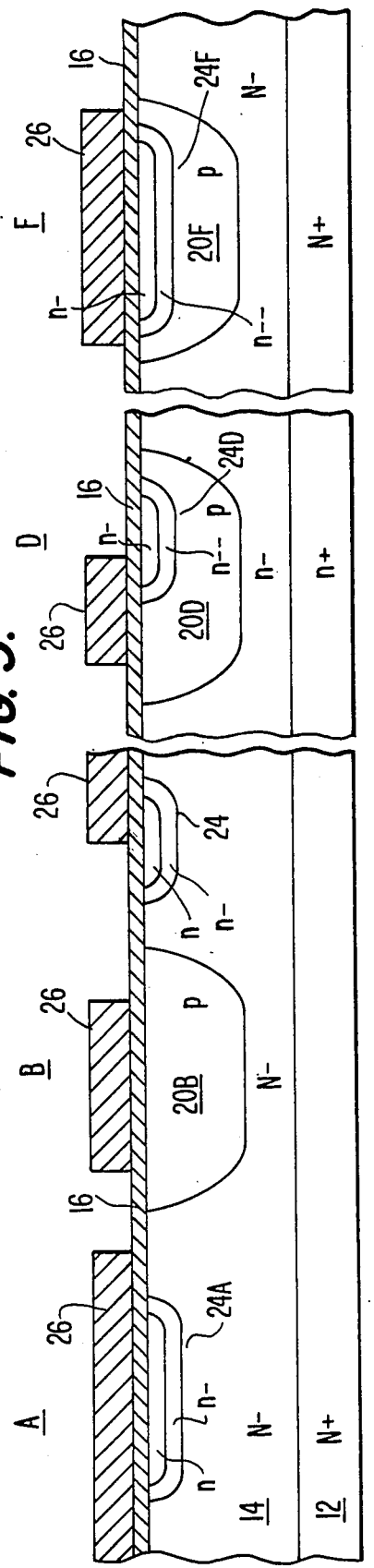
Figure 6:
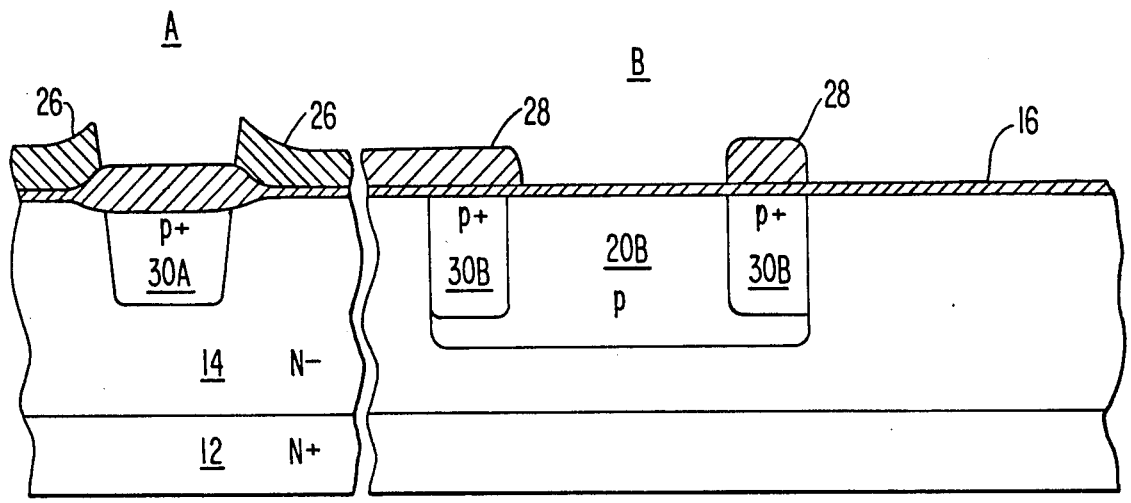

Referring now to FIGS. 5 and 6, the JFET photoresist 22 is removed and a relatively thin layer 26 of silicon nitride ($Si_3N_4$) is next deposited atop the entire wafer 10, preferably by a LPCVD technique. The silicon nitride layer 26 preferably has a thickness of approximately 1,200 angstroms. One or more openings are then formed in the silicon nitride layer 26, preferably using photolithographic etching techniques.

The silicon nitride layer 26 is used as a field oxide growth mask, leaving silicon nitride over most of those regions of the substrate 14 which are intended to become the active areas of the semiconductor circuit, and exposing those regions of the substrate 14 where thick field oxide is subsequently intended to be formed.

The wafer 10 is then exposed to an oxidizing ambient, causing a thick (i.e., approximately one micron) oxide layer 28 to grow on those surface areas of the wafer 10 from which the silicon nitride layer 26 has been removed.

The field oxide growth masking step may be utilized to create all of the thick oxide regions 28 of the final semiconductor product (i.e., all oxide regions having a thickness greater than approximately one micron). These thick oxide regions 28 include the region between the high voltage N channel MOSFET B and the high voltage P channel MOSFET C, as well as the oxide regions underneath the gates of the high voltage lateral N channel MOSFET D and the high voltage P channel MOSFET G.

4. Deep P+ Mask

Referring now to FIG. 6, after formation of the thick oxide region 28, one or more openings may be cut in the remaining portions of the silicon nitride layer 26. The same silicon nitride layer 26 which had been used for the field oxide growth masking step now functions as a deep P+ mask, leaving exposed those regions of the substrate 14 where subsequent deep P+ well formation is desired and serving as a mask or barrier to prevent ion implantation in those regions of the substrate 14 where deep P+ well formation is not desired.

A P type dopant, such as boron, is implanted into the substrate 14 directly through the removed regions of the silicon nitride layer 26. The single charged boron ions which are used for this implantation preferably have an energy of between approximately 30 KeV and 150 KeV, depending upon the desired junction depth. The boron implantation dose is approximately $5 \times 10^{15}/cm^2$. After implantation of the boron ions, the wafer 10 is heated to a relatively high temperature to thereby drive the boron dopant ions deeper into the substrate, providing a deep P+ well profile such as that of the deep P+ well 30A of the vertical DMOS power device A as illustrated in FIG. 6.

Formation of deep P+ wells 30 is also generally desirable wherever a high latch-up resistance is required, such as in the N channel MOSFET B of the CMOS region. As shown in FIGS. 1 and 6, the deep P+ wells 30 are generally formed on the source side of the P wells 20 of the N channel MOSFET devices, such as the deep P+ well 30B of the high voltage N channel MOSFET B, the deep P+ well 30D of the high voltage lateral N channel MOSFET D, and the deep P+ well 30F of the depletion mode N channel MOSFET F. The deep P+ masking step of the present invention may also be utilized to optionally form deep P+ wells 30 on both sides of the P wells 20 of the N channel MOSFET devices, as shown in FIG. 6, thereby further enhancing conductivity.

At this stage, the process sequence has produced a wafer 10 having an active area consisting of nitride 26 atop a thin oxide 16, with other regions consisting of a relatively thick field oxide 28 having JFET regions 24 implanted underneath and still other regions consisting of a relatively thinner oxide with deep P+ wells 30 implanted underneath.

It should be noted that the above-described deep P+ masking step may be done prior to the above-described field oxide growth masking step, so that the deep P+ wells are formed prior to the formation of the thick oxide layer. In either embodiment, only a single silicon nitride layer 26 is required to create both deep P+ regions and LOCOS regions. Therefore, the silicon nitride layer need be deposited only once for both masking steps.

5. Polysilicon Mask

Figure 7:
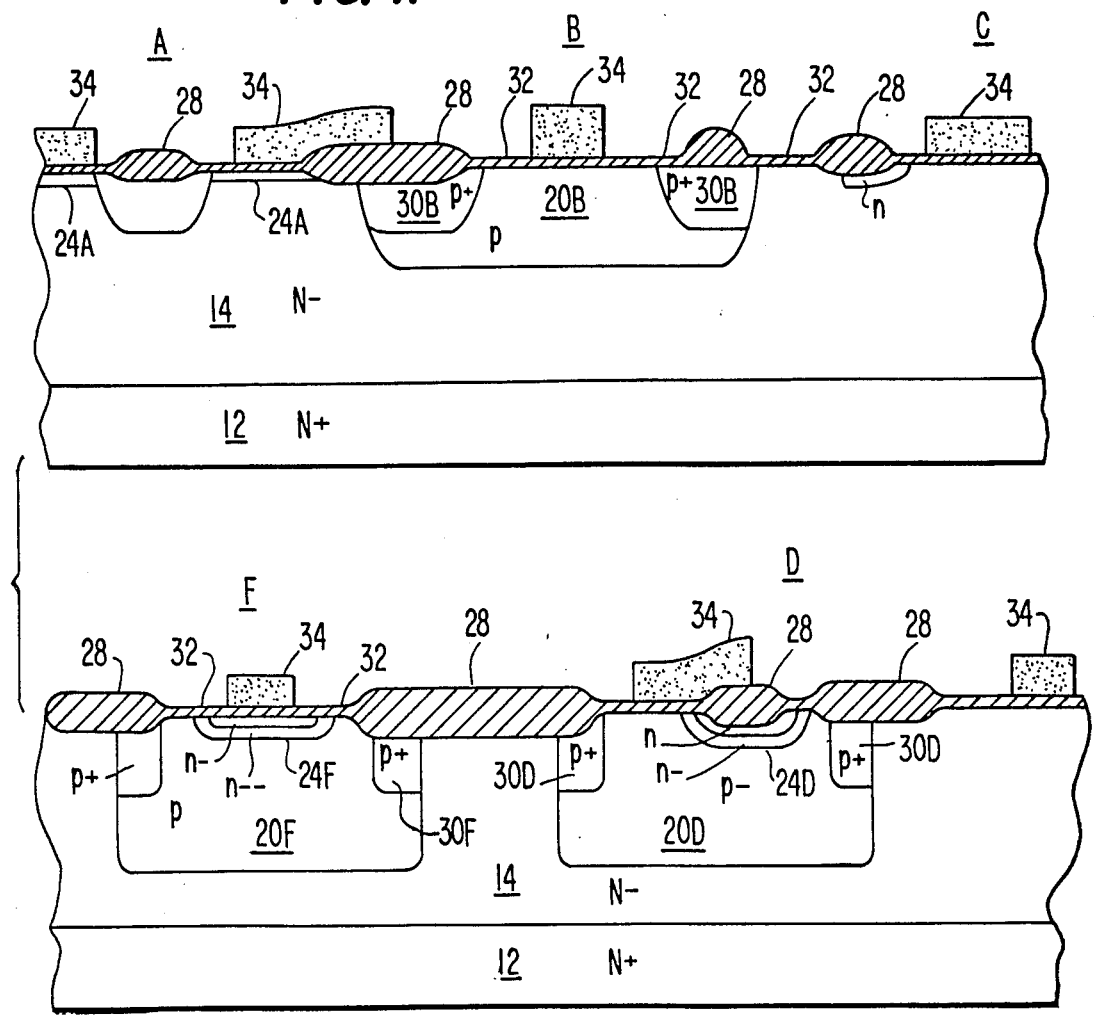

Referring now to FIG. 7, the remaining nitride layer 26 and thin oxide layer underneath the nitride are removed, and another layer 32 of high quality gate oxide is grown atop the wafer 10, preferably by a dry oxidation process.

A polysilicon layer 34 is then deposited atop the entire exposed surface of the wafer 10 and doped with an N+ type dopant. A photoresist is used to pattern the polysilicon layer 34, leaving polysilicon over those regions where formation of the gates of both the DMOSFET and the n channel and P channel MOSFET devices are desired.

The process of the present invention thereby allows the JFET regions 24 and the deep P+ regions 30 to be placed underneath the field oxide, enabling a very high field oxide threshold voltage and connection of polysilicon freely over the surface of the wafer without concern about parasistic MOSFET's and leakage current paths.

6. DMOS P well Mask

Figure 8:
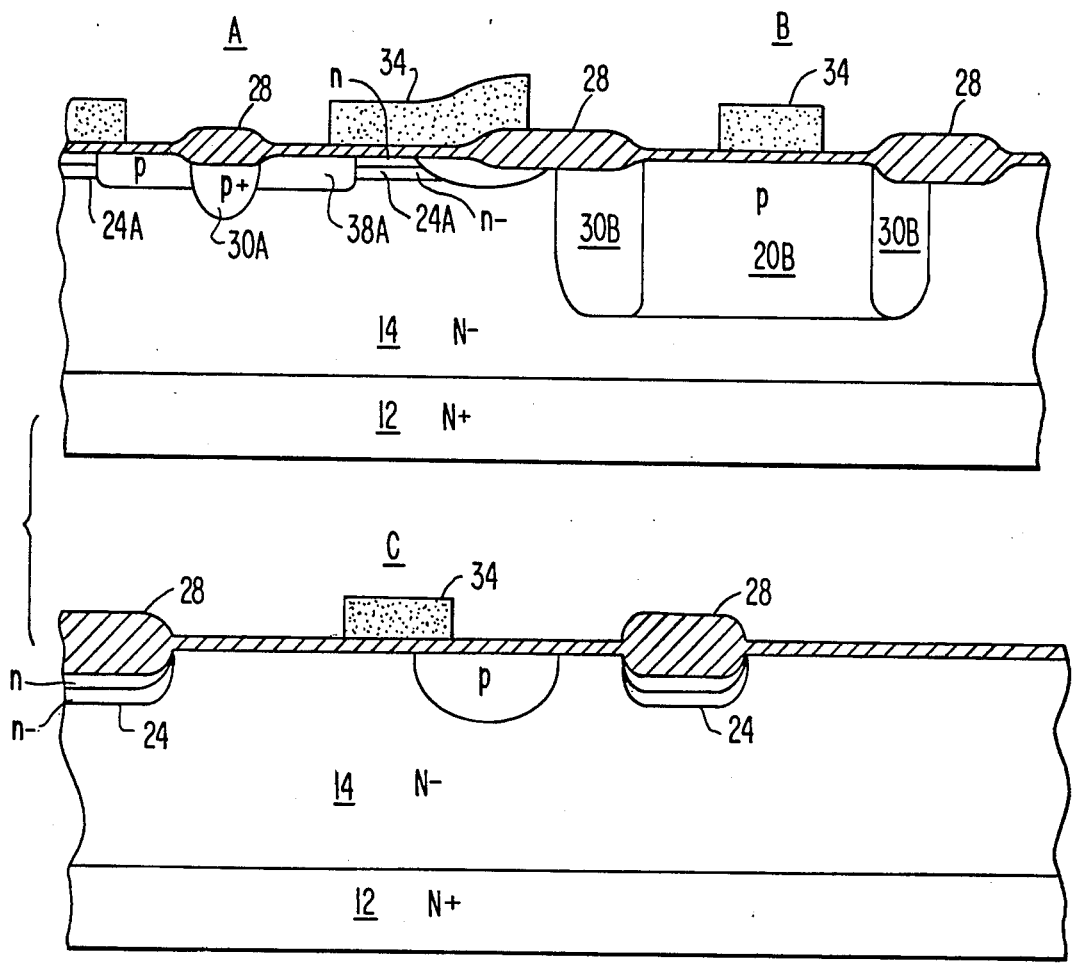

Referring now to FIG. 8, a "DMOS P well" photoresist is next deposited on top of at least a portion of the substrate 14. The DMOS P well photoresist is used to pattern the N− region of the substrate 14, leaving exposed those regions of the substrate 14 where subsequent DMOS P well formation is desired and serving as a mask or barrier to prevent ion implantation in those regions of the substrate 14 where DMOS P well formation is not desired.

A P type dopant ion, such as boron, is next implanted into those regions of the substrate 14 left exposed by the DMOS P well mask. The single-charged boron ions which are used for this implantation preferably have an energy of between approximately 30 KeV and 150 KeV, depending upon the desired depth of the DMOS P well regions. The boron implantation dose is between approximately $5 \times 10^{13}/cm^2$ and $5 \times 10^{14}/cm^2$.

As illustrated in FIG. 8, the DMOS P well mask 36 is used to form the P well regions 38A of the vertical DMOS power device A. The DMOS P well mask may also be used to form the P well region 38C on the drain side of the high voltage P channel MOSFET C.

It should be noted that, in th vertical DMOS power device A, a heavy concentration of "n" arsenic ions exists near the surface 15 as a result of the previous arsenic ion implantation which occured during the JFET masking step. This heavy concentration of n ions at the surface 15 produces a "pull back" effect in the subsequently created P wells 38A of the vertical DMOS power device A, "pulling" the border regions of the P wells 38A adjacent the surface 15 toward the deep P+ region 30A, as illustrated in FIG. 8.

7. n−/n+ Mask

Figure 9:
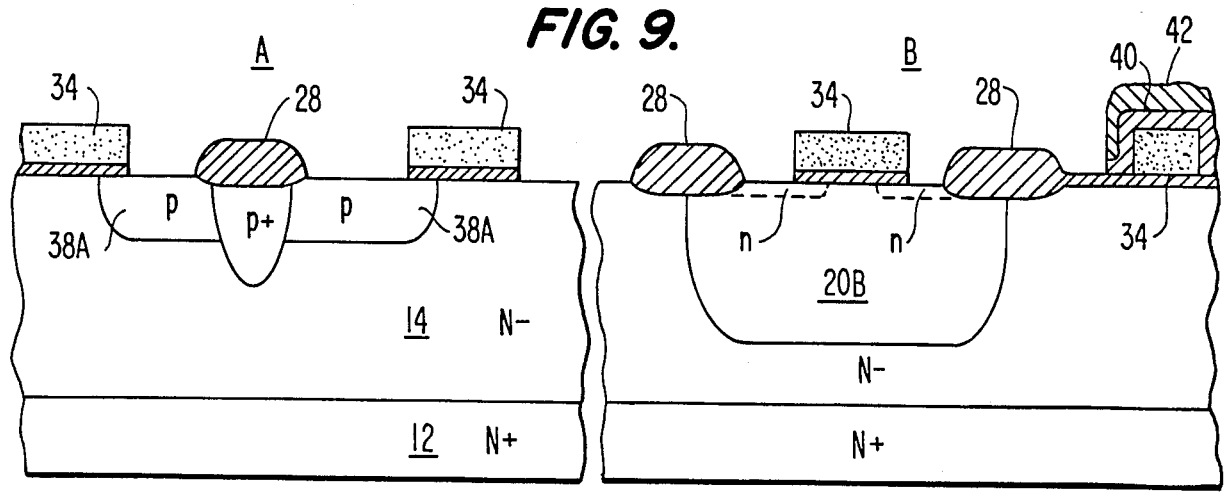

Referring now to FIG. 9, a layer of silicon dioxide 40 is next deposited atop the wafer 10, and a layer of silicon nitride 42 is formed atop the silicon dioxide layer 40. A portion of the silicon nitride layer 42 is removed from the vertical DMOS power device A, the high voltage N channel MOSFET B and the high voltage lateral N channel MOSFET D. The silicon dioxide layer 40 is then etched with Reactive Ion Etching (RIE).

The silicon dioxide layer 40 and the silicon nitride layer 42 are used as an n−/n+ mask, leaving exposed those regions of the substrate 14 where subsequent n−/n+ region formation is desired and serving as a mask or barrier to prevent ion implantation in those regions of the substrate 14 where n−/n+ formation is not desired. One of the primary functions of the silicon dioxide layer 40 and the silicon nitride layer 42 is to block the implantation of N type dopant ions into regions of the substrate 14 where P type dopant ions are subsequently to be implanted (as will be explained in greater detail below).

An N type dopant ion, such as phosphorous, is next implanted into those regions of the substrate 14 exposed by the silicon dioxide layer 40 and the silicon nitride layer 42. The phosphorous ion implantation dose is between approximately $5E12/cm^2$ and $1E13/cm^2$.

It should be noted that during this stage of the process sequence, the implantation of the phosphorous ions is also blocked by the polysilicon regions 34 which have been formed on the wafer surface as a consequence of the previously completed polysilicon masking step, as well as the thick oxide regions 28 which have been formed on the wafer surface as a result of the previously completed field oxide growth masking step. As a consequence, phosphorous ions will be implanted only in those regions of the substrate 14 which are not masked by the silicon dioxide layer 40, the silicon nitride layer 42, the polysilicon regions 34 and the thick oxide regions 28.

The phosphorous ion implant dosage and drive in time are preselected so that the phosphorous ion concentration is less than the concentration of boron ions previously implanted in the DMOS P well 38A during the preceding DMOS P well masking step. Thus, even though phosphorous ions are implanted in the DMOS P well region 38A during the n−/n+ masking step, the implanted phosphorous ions will have virtually no affect on the DMOS P well region 38A, since the charge per volume of the implanted phosphorous ions will be balanced or compensated for by the larger charge per volume of the previously implanted boron ions. By this careful selection of boron and phosphorous ion dosages and drive in times (to control junction depth), the need for a separate, additional mask to block implantation of phosphorous ions in the DMOS P well 38A of the vertical DMOS power device A is eliminated.

The implanted phosphorous ions form regions designated n− in the vertical DMOS power device A, the high voltage n channel MOSFET B, and the high voltage lateral N channel MOSFET D. During the drive in of the implanted phosphorous ions, a layer of oxide having a thickness of between 200 angstroms and 300 angstroms may be grown.

Figure 10:
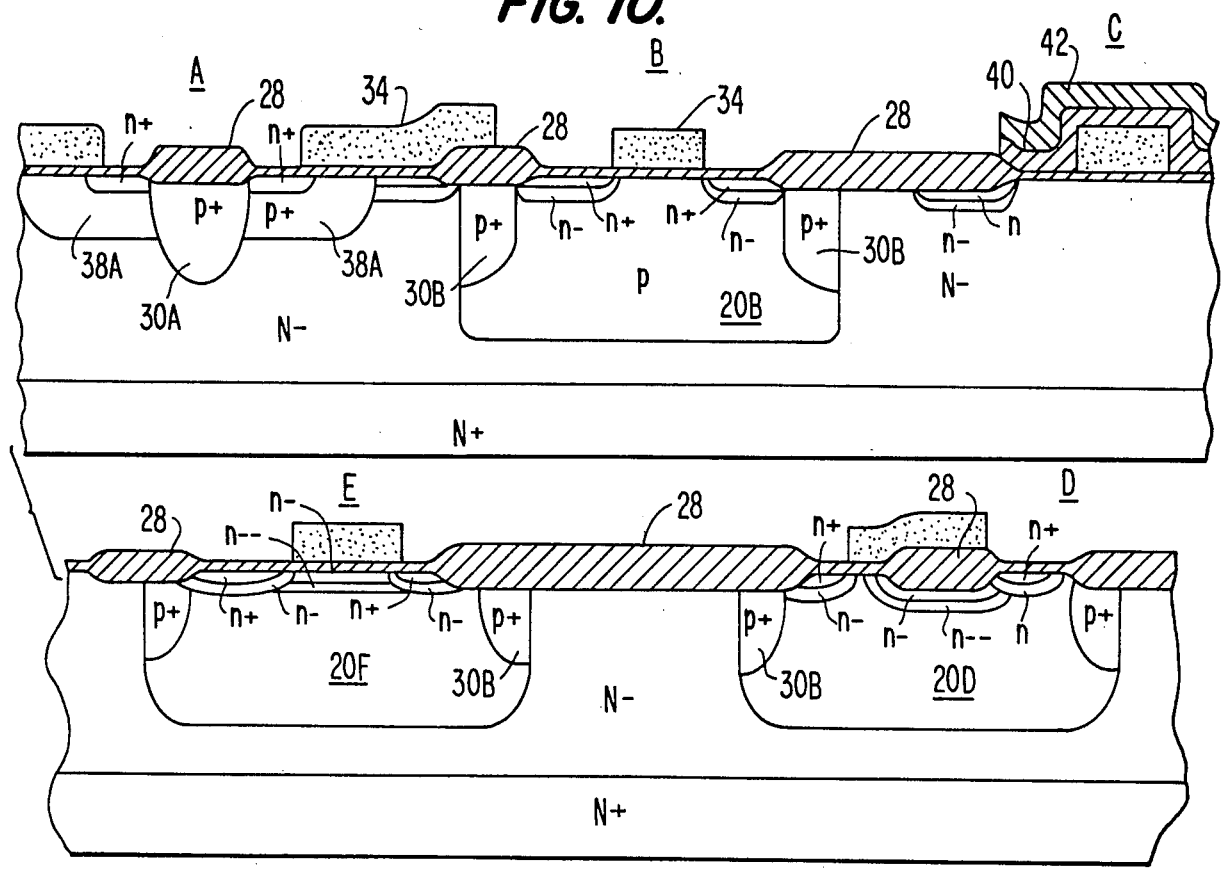

Referring now to FIG. 10, following the phosphorous ion implant, arsenic ions having an implant dosage of approximately $5E15/cm^2$ are implanted. A relatively low implant energy is selected for the arsenic ions so that the thin silicon nitride layer 42 may serve as a mask to prevent the arsenic ions from being implanted in the P channel MOSFET regions C, E and G.

In a manner similar to that described above with respect to the JFET masking step, the labels "n" and "n−" have been used in FIG. 10 to designate the relative concentrations of the implanted arsenic and phosphorous dopant ions, respectively. Because the implanted phosphorous ions tend to diffuse more rapidly, they will diffuse into a larger area than the arsenic ions. The charge per unit area of the phosphorous ion regions will therefore be relatively smaller than the charge per unit area of the arsenic ion regions. The phosphorous ion regions are therefore designated with the label "n−" and the arsenic ion regions are designated with the label "n+". The n−/n+ masking step may be utilized, for example, to create the n+ source region in the vertical DMOS power device A and the n+/n− source/drain region in the high voltage N channel MOSFET device B.

Figure 11:
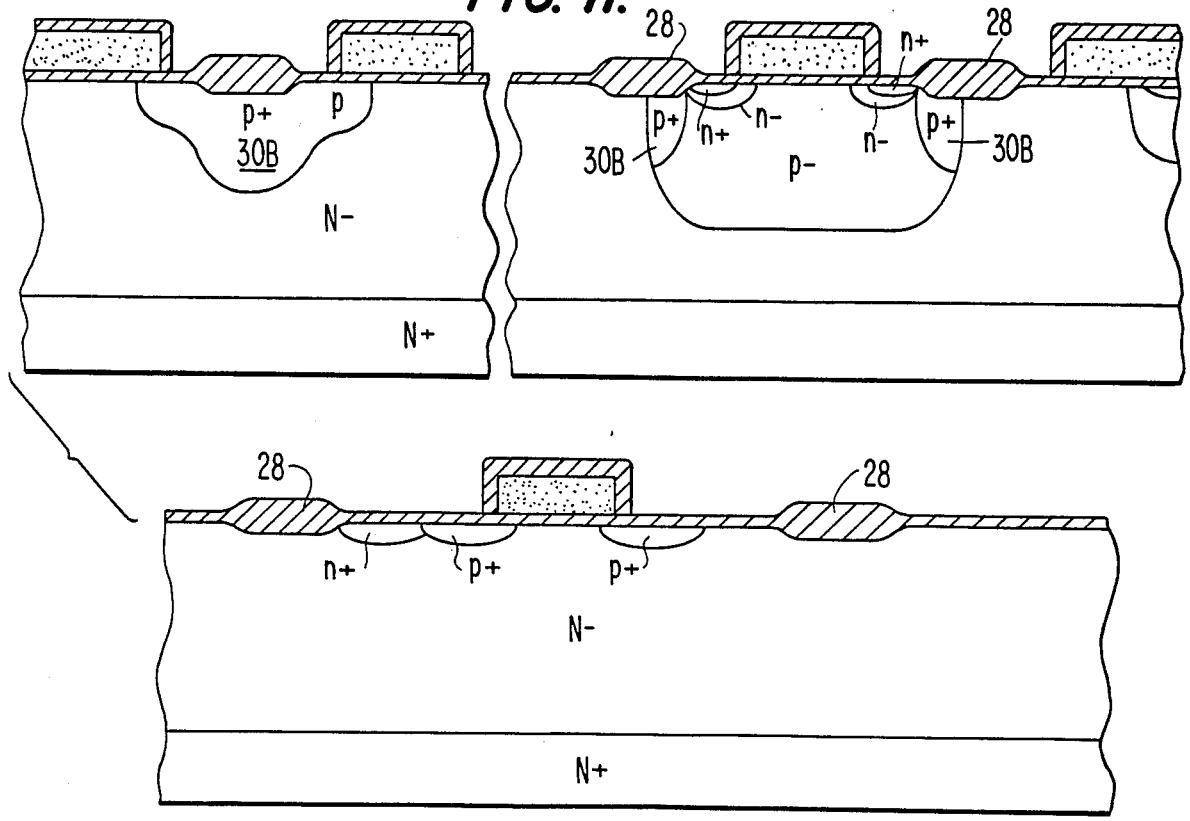

Referring now to FIG. 11, after the implantation of the arsenic ions, the arsenic ions are driven in and a layer of silicon dioxide 46 is grown. The silicon nitride layer 42 is then removed. A P type dopant ion, such as boron, is next implanted into the exposed regions of the substrate 14. The energy of the boron ions which are used for this implantation may be varied depending upon the desired depth of the shallow p+ region. The boron ions preferably have an implant dosage of between approximately $1E14/cm^2$ and $1E15/cm^2$.

The thickness of the silicon dioxide layer 46 is primarily dependent upon the duration of the drive in of the implanted arsenic ions. Since it is generally desirable to keep the implanted arsenic ion regions relatively shallow, a drive in of extended duration is generally undesirable. As a consequence, the silicon dioxide layer 46 will be relatively thin, and may not be able to fully mask some regions of the substrate 14 from the subsequent implantation of boron ions.

This thin oxide layer problem is solved in the present invention by carefully selecting the implant energy of the boron ions to be approximately one-tenth that of the implant energy of the arsenic ions. Therefore, even though boron ions may be implanted into the previously formed arsenic ion regions, they will have little or no effect due to their relatively low ion implant energy.

Shallow p+ regions are thereby formed only at exposed areas of the substrate 14 at which a previous n ion implant has not occurred, even though boron ions are implanted throughout the unmasked regions of the substrate 14. The implanted boron ions will have virtually no effect on the previously implanted arsenic ion regions, since the charge per volume of the implanted boron ions will be balanced or compensated for by the larger charge per volume of the previously implanted arsenic ions. By this careful selection of boron and arsenic ion dosages and drive in times (to control junction depth) an additional masking step for the creation of the shallow p+ regions is eliminated by the process of the present invention. Therefore, rather than defining the shallow p+ regions by a separate mask, the present invention permits these regions to be defined by the effects of the previous masking steps.

8. Contact Window Mask

Figure 12:
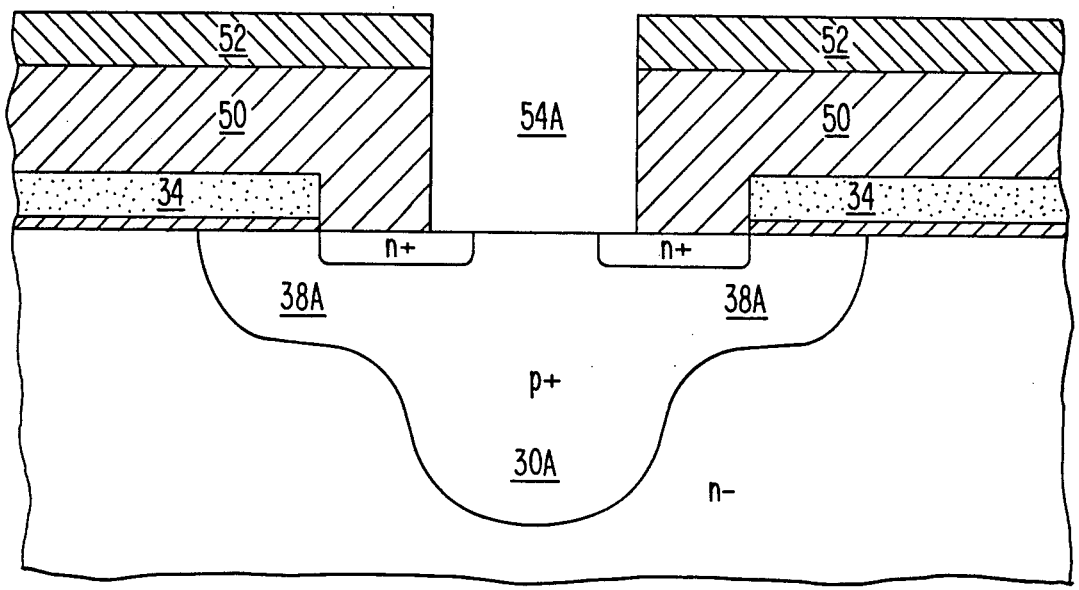

Next, as illustrated in FIG. 12 with respect to the vertical DMOS power device A, a layer of glass 50 may be deposited atop the entire wafer. Using a photolithographic mask 52, one or more contact windows 54a may be opened through the glass layer 50 to the surface of the wafer. This procedure may be suitably accomplished by a number of known techniques, such as immersing wafer 10 in a hydrofluoric acid based solution for an interval sufficient to remove the layers exposed by the contact window mask.

9. Metalization Mask

Figure 13:
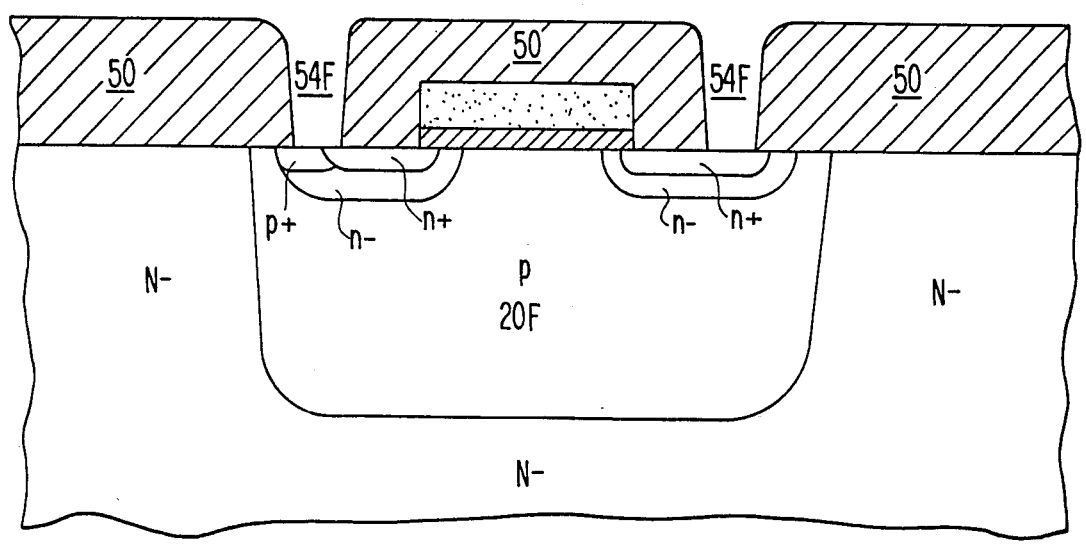

As illustrated in FIG. 13 with respect to the low voltage depletion mode MOSFET F, a metalization layer 56 may next be applied to wafer 10, for example, by the known technique of evaporation of aluminum or an aluminum alloy.

In general, the power device of the final semiconductor circuit will require a thicker metalization layer (i.e., approximately 3 microns) than the IC section of the semiconductor circuit. If a single metalization layer is used for the entire semiconductor circuit, the circuit density of the IC section may be adversely affected.

Therefore, in an alternative embodiment of the present invention, the process of opening the contact windows and forming the metalization layer for the IC section may be conducted separately from the process of opening the contact windows and forming the metalization layer for the power section. For example, the contact windows for the power section may be opened and a first metalization layer may be formed, after which the contact windows for the IC section may be opened and a second metalization layer may be formed. This alternative process of the present invention is particularly well-suited for the fabrication of semiconductor products requiring a high circuit density.

10. Overglass Mask

A glass layer may then be deposited atop the wafer, and the glass layer may be etched to open up holes for pad bonding, in a manner which is well known to those skilled in the art.

It will therefore be recognized that the present invention may be embodied in a variety of specific forms. The foregoing disclosed embodiments are therefore to be considered in all respects as illustrative and not restrictive, the scope of the invention being indicated by the appended claims, rather than the foregoing description, and all variations which come within the meaning and range of equivalency of the claims are intended to be embraced therein.

What is claimed:

1. A process of fabricating a power integrated circuit device including a vertical DMOS, a high voltage CMOS and MOSFETs having high and low thresholds and depletion mode characteristics on a wafer of semiconductor material, said wafer comprising a substrate and a wafer layer thereon containing a dopant of first conductivity type, said process comprising sequentially performing the steps of:

(a) forming a first photoresist layer on said wafer layer;
   opening one or more windows in said first photoresist layer to selectively expose said wafer layer;
   introducing a dopant of second conductivity type through said one or more windows in said first photoresist layer to form one or more first regions of predetermined depth in said wafer layer;
   removing said first photoresist layer from said wafer layer;

(b) forming a second photoresist layer on said wafer layer;
   opening one or more windows in said second photoresist layer to selectively expose said wafer layer;
   introducing a dopant of first conductivity type through said one or more windows in said second photoresist layer to form one or more second regions of predetermined depth in said wafer layer;
   removing said second photoresist layer from said wafer layer;

(c) forming a silicon nitride layer on said wafer layer;
   opening one or more windows in said silicon nitride layer to selectively expose said wafer layer;
   forming an oxide layer on said wafer layer in the regions exposed by said one or more first windows in said silicon nitride layer;

(d) opening one or more second windows in said silicon nitride layer to selectively expose said wafer layer;
   introducing a dopant of second conductivity type through said one or more second windows in said silicon nitride layer to form one or more third regions of predetermined depth in said wafer layer;
   removing said silicon nitride layer from said wafer layer;

(e) forming a polysilicon layer on said wafer layer;
   introducing a dopant of first conductivity type into said polysilicon layer;
   removing selected portions of said polysilicon layer from said wafer layer;

(f) forming a third photoresist layer on at least a portion of said wafer layer;
   opening one or more windows in said third photoresist layer to selectively expose said wafer layer;
   introducing a dopant of second conductivity type through said one or more windows in said third photoresist layer to form one or more fourth regions of predetermined depth in said wafer layer;

(g) forming a layer of silicon oxide on at least a portion of said wafer layer;
   opening one or more windows in said layer of silicon oxide to selectively expose said wafer layer;
   introducing a dopant of first conductivity type through said one or more windows in said silicon oxide layer to form one or more fifth regions of predetermined depth in said wafer layer.

2. A process as in claim 1 wherein said second type of dopant comprises P type dopant ions and said one or more first regions include at least one CMOS P well.

3. A process as in claim 1 wherein said first type of dopant introduced through said one or more windows in said second layer comprises:
   first N type dopant ions;
   second N type dopant ions, said first N type dopant ions and said second N type dopant ions differing in diffusion characteristics, and
   wherein said one or more second regions include at least one JFET region.

4. A process as in claim 1 wherein said second type of dopant comprises P type dopant ions and said one or more third regions include at least one deep P+ well.

5. A process as in claim 1 wherein said second type of dopant comprises P type dopant ions and said one or more fourth regions include at least one DMOS P well.

6. A process as in claim 1 wherein the charge per volume of said second type of dopant in said one or more fourth regions is substantially greater than the charge per volume of said first type of dopant in said one or more fifth regions.

7. A process according to claim 1 wherein a layer of silicon oxide is on the wafer surface.

8. A process according to claim 1 wherein in step (a) the dopant of second conductivity type is boron.

9. A process according to claim 1 wherein in step (b) the dopant of first conductivity type is introduced by ion implantation.

10. A process according to claim 1 wherein in step (c) said silicon oxide layer is about one micron thick.

11. A process according to claim 1 wherein in step (d) the dopant is boron introduced by ion implantation.

12. A process according to claim 1 wherein in step (g) the dopant is phosphorus introduced by ion implantation.

13. A process according to claim 1 wherein in step (g) a silicon nitride layer is deposited over the silicon oxide layer.

14. A process according to claim 1 wherein a glass layer is deposited over the wafer following step (g).

15. A process according to claim 8 wherein the wafer layer is heated to drive the boron into the substrate, forming a deep p well.

16. A process according to claim 9 wherein the dopant of first conductivity type is a combination of phosphorous and arsenic thereby forming a high concentration of arsenic dopant atoms at the wafer surface and phosphorus atoms further removed from said surface.

17. A process according to claim 11 wherein after said boron implantation the wafer is exposed to a high temperature to drive the boron atoms into the substrate forming one or more deep p+ wells.

18. A process according to claim 12 wherein the concentration of phosphorus is less than the concentration of boron implanted in step (d).

19. A process according to claim 13 wherein in step (8) the phosphorus implant is followed by a low energy level implant of arsenic.

20. A process according to claim 14 wherein window openings are formed in the glass layer and metal is deposited into the windows.

21. A process according to claim 19 wherein a thin silicon oxide layer is grown over the exposed areas of the wafer.

22. A process according to claim 20 wherein the metal is aluminum deposited by evaporation.

23. A process according to claim 21, wherein the arsenic implant and silicon oxide formation is followed by a low energy level implant of boron.

24. A process according to claim 22 wherein a second glass layer is deposited over the wafer.

25. A process according to claim 22 wherein openings are made in the glass layers and metal is deposited in the openings to form bond pads.

* * * * *